(12) United States Patent
Faue et al.

(10) Patent No.: US 9,350,338 B2
(45) Date of Patent: *May 24, 2016

(54) LINEAR PROGRESSION DELAY REGISTER

(71) Applicant: United Memories, Inc., Colorado Springs, CO (US)

(72) Inventors: Jon Allan Faue, Colorado Springs, CO (US); Shane Pinit Yingtavorn, Colorado Springs, CO (US)

(73) Assignee: United Memories, Inc., Colorado Springs, CO (US)

( * ) Notice: Subject to any disclaimer, the term of this patent is extended or adjusted under 35 U.S.C. 154(b) by 15 days.

This patent is subject to a terminal disclaimer.

(21) Appl. No.: 14/476,523

(22) Filed: Sep. 3, 2014

(65) Prior Publication Data

US 2016/0065193 A1 Mar. 3, 2016

(51) Int. Cl.
*H03K 5/159* (2006.01)
*H03K 5/13* (2014.01)
*H03K 5/00* (2006.01)

(52) U.S. Cl.
CPC ...... *H03K 5/131* (2013.01); *H03K 2005/00058* (2013.01)

(58) Field of Classification Search
USPC ................ 327/262–263, 276–277, 284–285, 327/512–513
See application file for complete search history.

(56) References Cited

U.S. PATENT DOCUMENTS

| | | | | |
|---|---|---|---|---|
| 4,899,071 A * | 2/1990 | Morales | ................ | H03K 5/133 327/277 |
| 5,163,067 A * | 11/1992 | Wight | .................. | H04L 7/0337 341/70 |
| 7,786,776 B2 * | 8/2010 | Yamakido | ............... | H03L 7/085 327/149 |

* cited by examiner

*Primary Examiner* — An Luu
(74) *Attorney, Agent, or Firm* — Peter J. Meza; Hogan Lovells US LLP

(57) ABSTRACT

An adjustable delay line includes a series of delay elements for adjusting the accumulative delay. Each element has a plurality of registers indicating to various devices within the delay element to be 'on' or 'off', thereby changing the time delay through the element. A master control indicates to the delay line whether to go faster (increment) or go slower (decrement). When one of these control signals is applied to the delay line, it is applied to half the elements, either the odd or the even numbered elements. Only one element will have its state changed by the increment or decrement control signal, and it will be the element for which the previous delay's corresponding element is already set or un-set depending upon the applicable case.

20 Claims, 10 Drawing Sheets

NORMAL OPERATION MODE

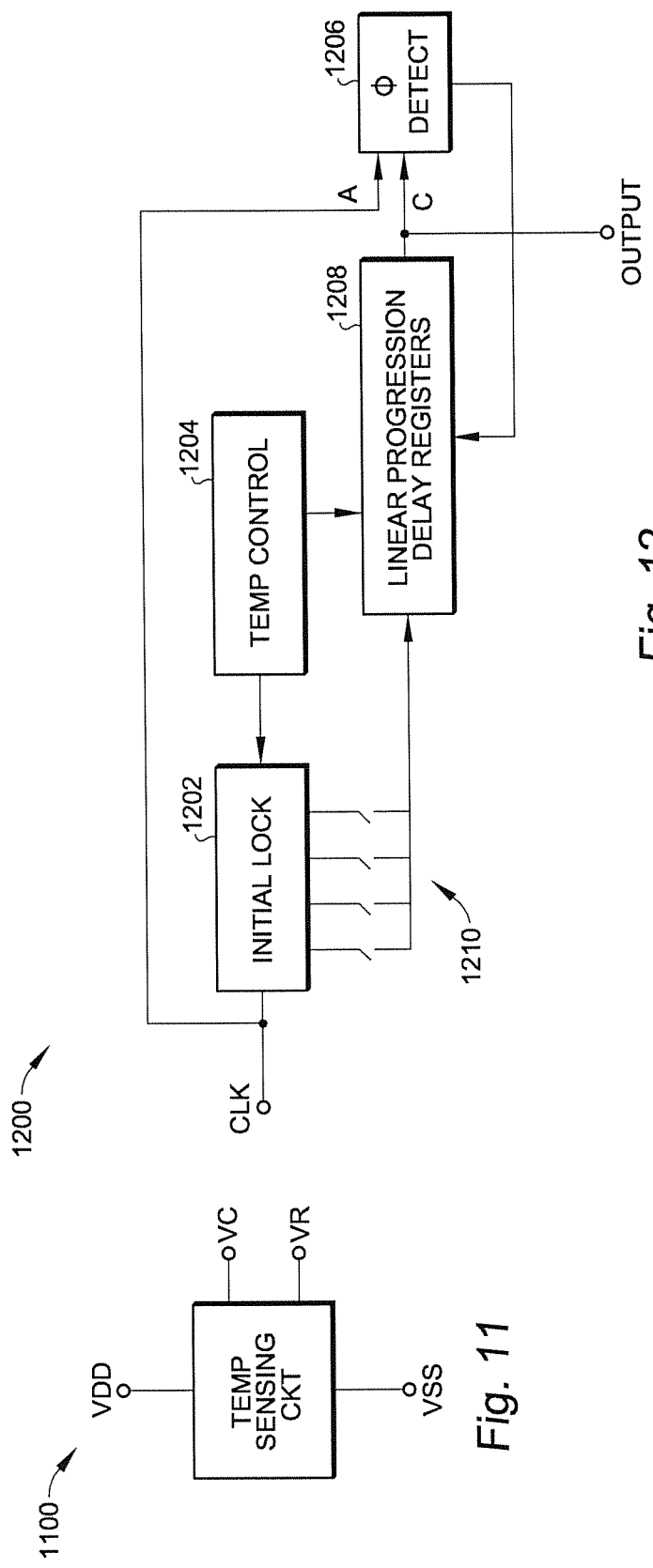

LINEAR PROGRESSION DELAY REGISTER

CROSS-REFERENCE TO RELATED APPLICATIONS

The present application is related to the subject matter disclosed in U.S. patent application Ser. No. 14/476,541 for: "LINEAR PROGRESSION DELAY REGISTER", assigned to the assignee hereof and filed on even date herewith, the disclosure of which is herein specifically incorporated by reference in its entirety.

BACKGROUND OF THE INVENTION

The present invention is related to a digital Delay-Locked Loop (DLL), and more specifically to an improved version of the adjustable delay portion of the DLL typically found in such circuits.

Purely digital adjustable delay lines are typically controlled by counter-type circuits. If these delay lines adjust the delay based on temperature and/or voltage changes, they can exhibit glitches or possibly even run out of adjustable range if the delay line has been divided into course versus fine segments. Analog delay lines handle the adjustments better, but are known to have more issues with jitter as the delay is never actually stable, but rather constantly adjusting. This is especially true if the analog delay line has to be biased in such a way that large adjustments are to be required after initial lock due to expected temperature changes.

Referring now to FIG. 1, a typical DLL 100 is shown including an adjustable delay line 102 for receiving a CLK clock input and for providing a delayed, locked clock signal at an OUTPUT output node. A fixed delay block 104 is coupled between the output of the adjustable delay line 102 and node 108. A phase detect circuit 106 receives the CLK signal at a first input node, and the delay CLK signal at a second input node. The first and second input nodes of the phase detect circuit 106 are shown receiving respect clock pulses A and C, which is explained further below with respect to FIG. 2. The output of the phase detect circuit 106 is coupled to a control input of the adjustable delay line 102.

Referring now to FIG. 2, a timing diagram is shown including the two signal waveforms corresponding to the input CLK signal, and the delayed CLK signal at node 108. Note in FIG. 2 that the leading edge of the "C" CLK pulse is locked to the leading edge of the "A" pulse of the delayed CLK signal at node 108.

What is desired, therefore, is an improved adjustable delay line suitable for use in a DLL of the type shown in FIG. 1 that does not have the problems associated with prior art digital and analog delay lines described above.

SUMMARY OF THE INVENTION

According to an embodiment of the present invention, a series of delay elements are assembled for the purpose of adjusting the accumulative delay. Each element has a plurality of registers indicating to various devices within the delay element to be 'on' or 'off', thereby changing the time delay through the element.

A master control, usually based on a phase detector of some sort, indicates to the delay line whether to go faster (increment) or go slower (decrement). When one of these control signals is applied to the delay line, it is applied to half the elements, either the odd or the even numbered elements. Only one element will have its state changed by the increment or decrement control signal, and it will be the element for which the previous delay's corresponding element is already set or un-set depending upon the applicable case. In the case of incrementing, the element that is currently un-set, but having a previous element set will change to a set state. In the case of decrementing, the element that is currently set, but having a previous element unset, will change to a un-set set state, i.e. it will be decremented. Each element has the same delay, and the amount of adjustment per element is also the same. This avoids glitches in the line when changing from different values of delay per stage at boundary conditions, a typical case when controlled by a counter.

The physical placement of the elements can also be arranged such that adjacent elements in terms of programming are not physically adjacent. This keeps the signal that is propagating (typically a clock) from encountering a series of added delays and then a series of no delays. Having all the delays congregated in one area of the line can lead to signal distortion and even filtering in extreme cases.

The series of delay elements can be easily reset in such a way that the ability to go fast and slower from that point is equal. Essentially, the number of 'off' registers is equal to the number of 'on' registers at the default starting condition.

Alternating stages within the delay elements can also be controlled by a separate set of control signals so that the duty cycle of the signal propagating through the line can be modulated, not just the total delay.

The adjustments of the delay line are purely digital, thus the deficiencies of the analog type delay lines are avoided.

The digital adjustments are added in a linear fashion with the delay line, there is no control from a master counter indicating how much delay to add or subtract. When an adjustment is needed in the line, delay is added or subtracted within a single stage based on the state of the previous stage.

Furthermore, control of the increment/decrement signals is each divided into an odd and even sub-type, thereby building in a master-slave relationship within all the delay registers so run-through is avoided.

This delay line is easily reset. It can also be reset into a state so that going faster or slower from the reset starting point are equally feasible. This is necessary if temperature changes are expected from the initial lock point.

Since a counter is not used, any number of delay stages can be utilized, it does not need to be a number that is $2^n$, where n is an integer.

The registers can also be arranged such that the delay is successively added to non-adjacent delay elements; this avoids the programmable delay being significantly larger within specific sections of the line which could lead to signal distortion.

BRIEF DESCRIPTION OF THE DRAWINGS

FIG. 11 is a generalized temperature sensitive control circuit for generating linear temperature control signals for the adjustable delay line stage shown in FIG. 4; and FIG. 12 is a schematic diagram of a DLL further comprising a feature for preventing the delay elements from being digitally controlled after an initial locking period.

DETAILED DESCRIPTION

Figure 1:
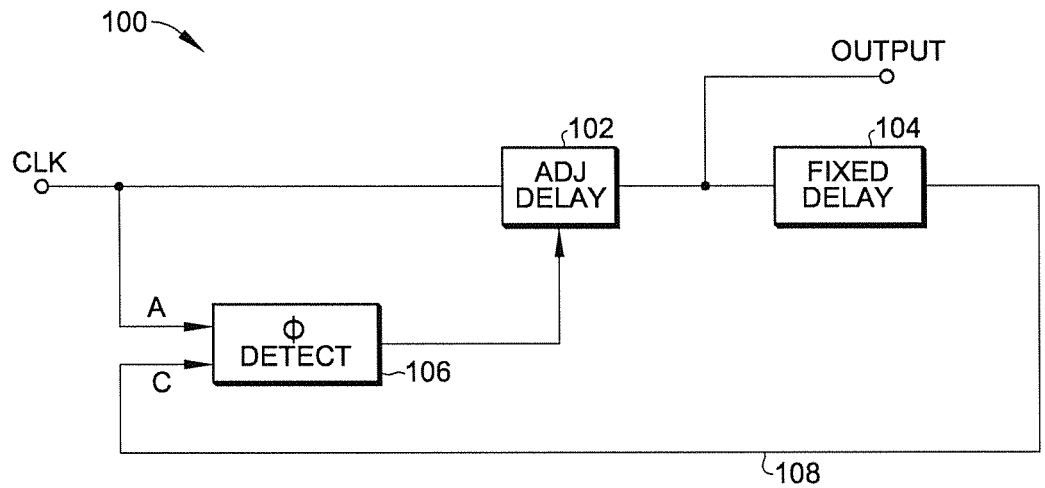
FIG. 1 is a high-level schematic diagram of a DLL according to the prior art.
Figure 2:
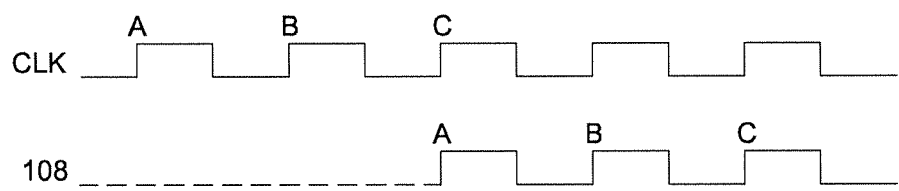
FIG. 2 is a timing diagram showing a clock signal and a locked delayed clock signal associated with the DLL of FIG. 1 according to the prior art.
Figure 3A:
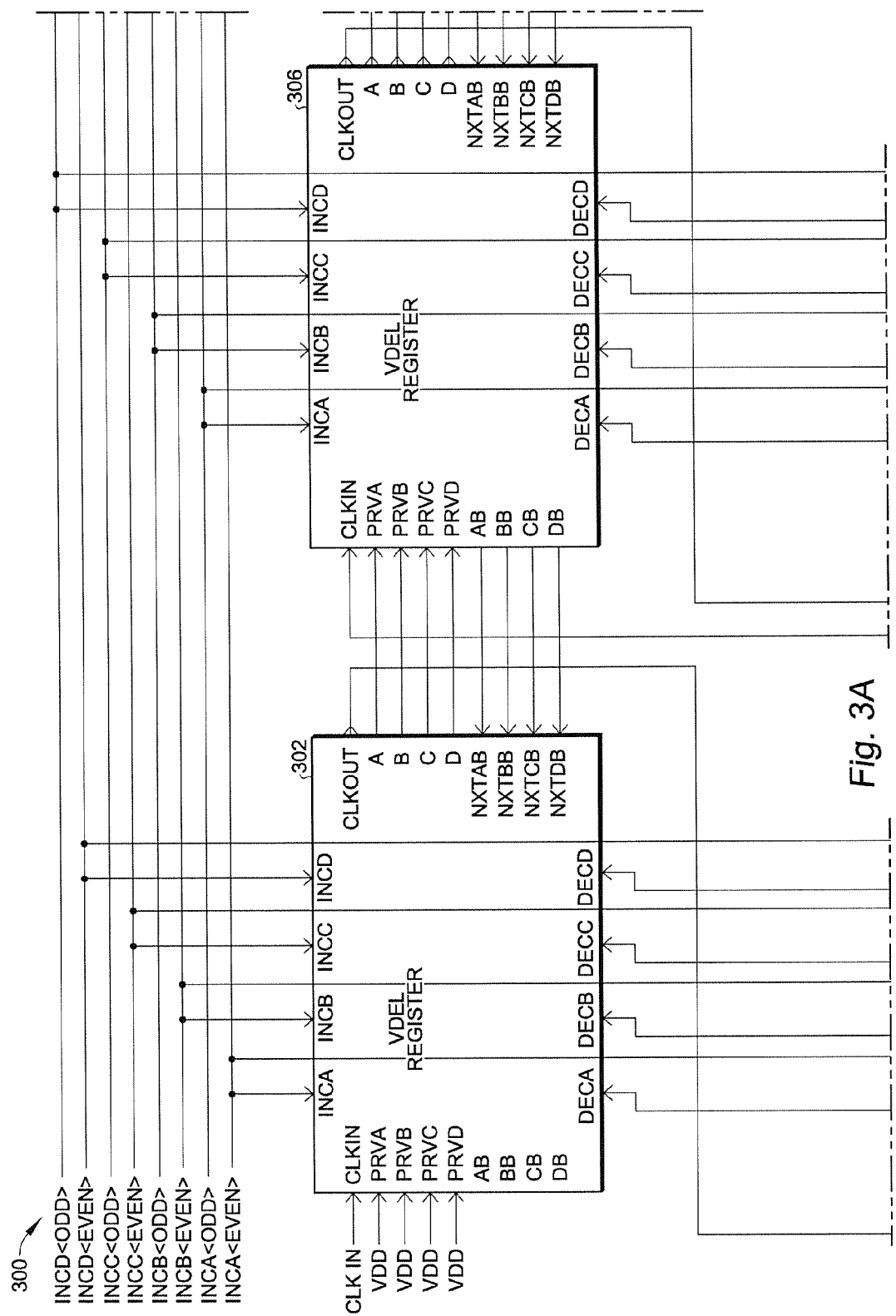
FIGS. 3A-3D are high-level schematic diagrams of an adjustable delay line according to the present invention.
Figure 3B:
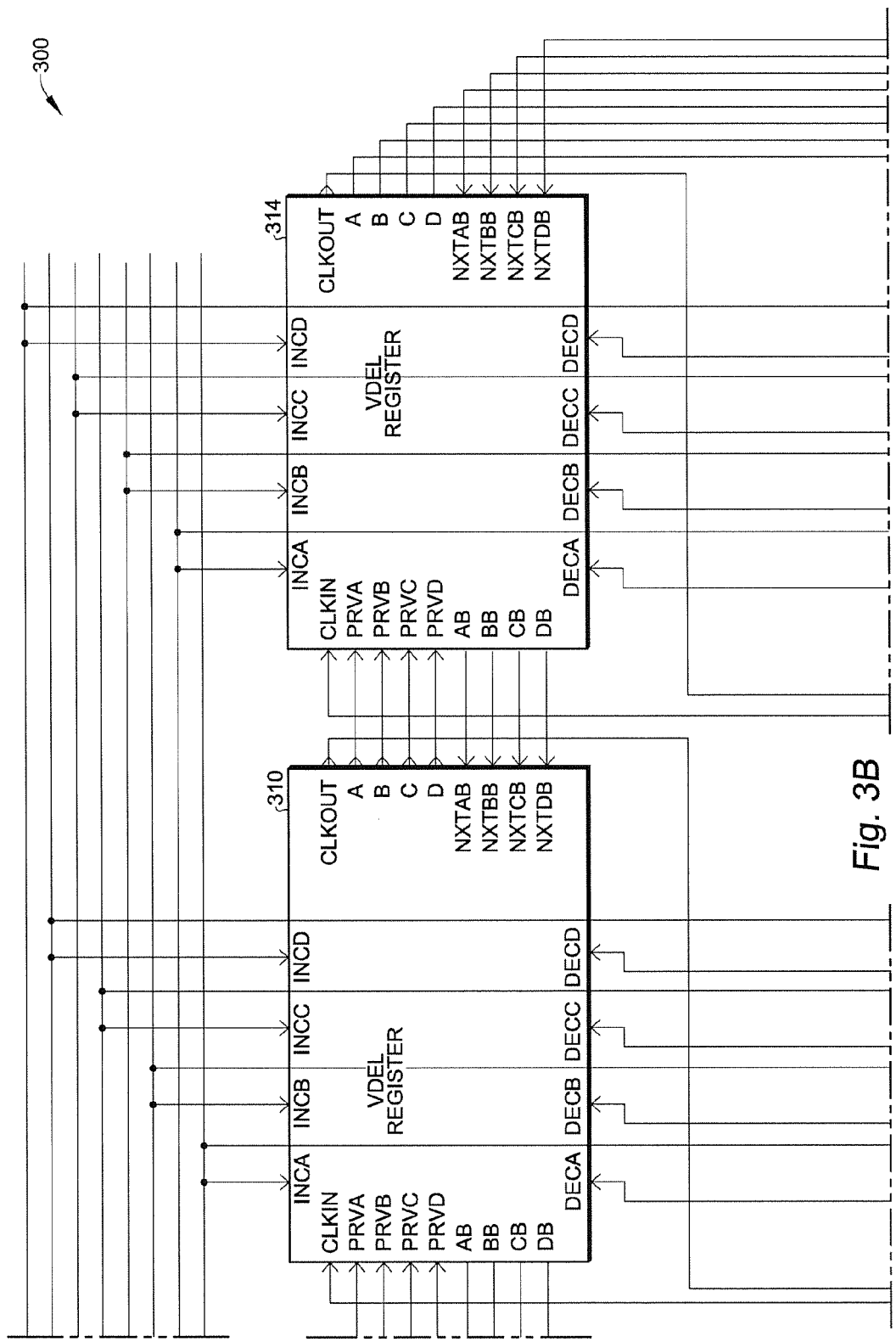
Figure 3C:
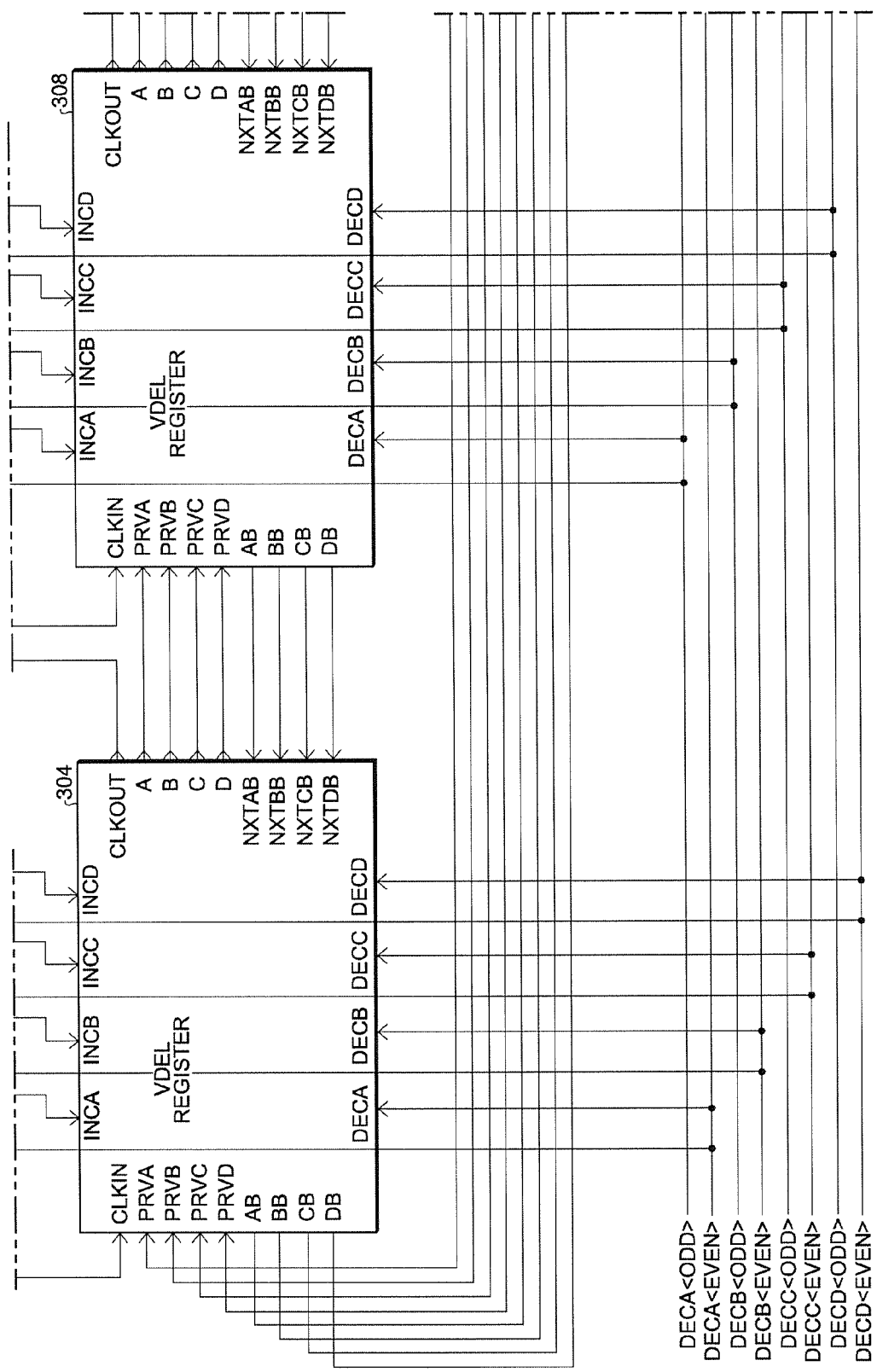
Figure 3D:
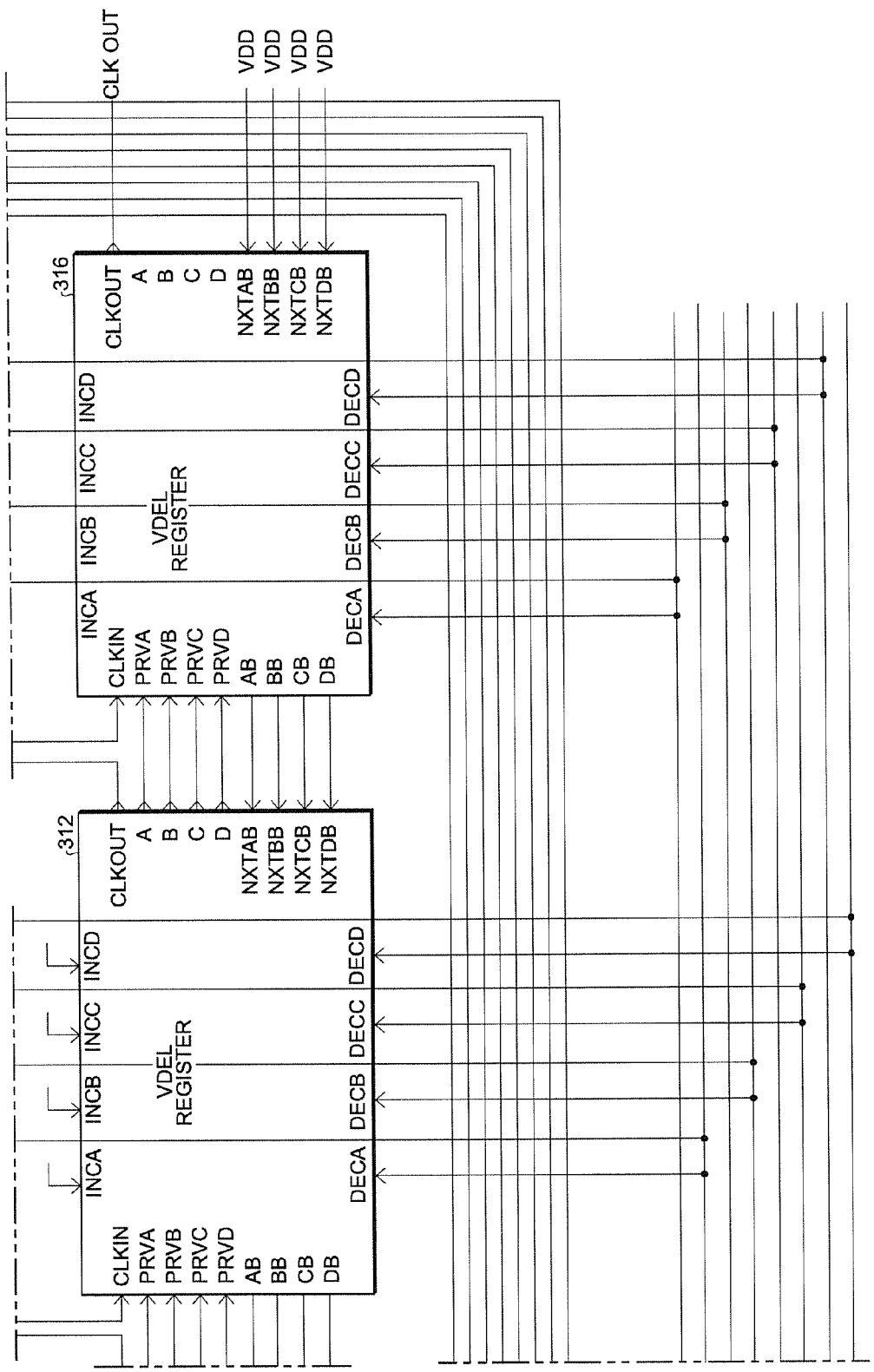

Digital DLLs are known to lock with precision based on the initial conditions, but are not good at adapting to changing conditions, particularly temperature changes. Known DLLs have counters and as they increment or decrement over the binary boundaries, glitches or oscillations can result in the phase detector. Analog DLLs adapt well to changing conditions, but are constantly adjusting so they have issues with jitter.

An embodiment of the present invention solves the issue in two ways. Firstly, a second parallel control path is added to the delay loop so that temperature effects are adjusted separately from the normal phase detector adjusts. Control for this path is completely separate from the digital control and is analog based. Secondly, the digital portion of the adjustable delay loop is configured as a "Linear Progression Delay Register." Each delay element is not controlled by a counter state, but rather is incremented or decremented based only on the state of the preceding register. Note the directions for incrementing and decrementing are different.

Referring now to FIGS. 3A-3D, the adjustable delay line 300 according to the present invention is shown including registers (dual delay cells) 302, 304, 306, 308, 310, 312, 314, and 316. Each register includes increment inputs INCA, INCB, INCC, and INCD. Each register includes decrement inputs DECA, DECB, DECC, and DECD. Each register includes signal inputs CLKIN, PRVA, PRVB, PRVC, and PRVD (left side of the register) and signal inputs NXTAB, NXTBB, NXTCB, and NXTDB (right side of the register). Each register includes signal outputs CLKOUT, A, B, C, and D (right side of the register) and signal outputs AB, BB, CB, and DB (left side of the register). The internal structure of each register is described in further detail below with respect to FIGS. 4-8.

Control line INCA<EVEN> is coupled to the *INCA* input of registers 302, 304, 310, and 312. Control line INCA<ODD> is coupled to the INCA input of registers 306, 308, 314, and 316. Control line INCB<EVEN> is coupled to the INCB input of registers 302, 304, 310, and 312. Control line INCB<ODD> is coupled to the INCB input of registers 306, 308, 314, and 316. Control line INCC<EVEN> is coupled to the INCC input of registers 302, 304, 310, and 312. Control line INCC<ODD> is coupled to the INCC input of registers 306, 308, 314, and 316. Control line INCD<EVEN> is coupled to the INCD input of registers 302, 304, 310, and 312. Control line INCD<ODD> is coupled to the INCD input of registers 306, 308, 314, and 316.

Control line DECA<EVEN> is coupled to the DECA input of registers 302, 304, 310, and 314. Control line DECA<ODD> is coupled to the DECA input of registers 306, 308, 314, and 316. Control line DECB<EVEN> is coupled to the DECB input of registers 302, 304, 310, and 314. Control line DECB<ODD> is coupled to the DECB input of registers 306, 308, 314, and 316. Control line DECC<EVEN> is coupled to the DECC input of registers 302, 304, 310, and 314. Control line DECC<ODD> is coupled to the DECC input of registers 306, 308, 314, and 316. Control line DECD<EVEN> is coupled to the DECD input of registers 302, 304, 310, and 314. Control line DECD<ODD> is coupled to the DECD input of registers 306, 308, 314, and 316.

Except for the inputs of register 302 (the first register in the delay line) and the outputs of register 316 (the last register in the delay line) the coupling of registers 302/306, 306/310, 310/314, 314/304, 304/308, 308/312, 312/316 is now described. Output signal nodes A, B, C, and D in a first register are respectively coupled to signal input nodes PRVA, PRVB, PRVC, and PRVD in a second register. Output signal nodes AB, BB, CB, and DB in the second register are respectively coupled to signal input nodes NXTAB, NXTBB, NXTCB, and NXTDB in the first register. In register 302, PRVA, PRVB, PRVC, and PRVD are coupled to VDD and AB, BB, CB, and DB are left open. In register 316, NXTAB, NXTBB, NXTCB, and NXTDB are coupled to VDD and A, B, C, and D are left open.

The clock signal for the delay line 300 shown in FIGS. 3A-3D is routed from the CLKOUT node of a first register to the CLKIN node of a second register in the following coupling of registers 302/304, 304/306, 306/308, 308/310, 310/312, 312/314, 314/316. Note that register 302 initially receives the input clock signal at the CLKIN node, and the delayed clock signal is provided at the CLKOUT node of register 316.

Two separate increment controls (INCA<EVEN>, INCA<ODD>, for example) are used so the register automatically is configured as a master/slave and run-through is prevented. The same is true for the decrement control, two lines are used to make a master/slave configuration (DECA<EVEN>, DECA<ODD>, for example). It is important to note that when prompted to 'increment,' the increment control must alternate between Odd-Even stage increments. The same is true for decrement control.

Another feature of the present invention is that the register does not increment in a truly linear fashion, but skips stages so 'delay' is not added in adjacent stages. Adding all the delay in adjacent stages, but none in other areas could lead to signal distortion resulting in duty cycle issues of no function at higher frequencies. This can be clearly seen by the physical layout of the registers 302-316 as is shown in FIGS. 3A-3D.

Any number of programmable delay stages can be used or added. A number that is a power of two ($2^n$) is not necessary as is required in counter-controlled variable delay lines.

Resetting is accomplished easily by forcing both increment control lines (INCA<ODD> and INCA<EVEN>, for example) high at the same time thus defeating the master/slave properties of the present invention and letting the desired state run (or progress) down the register chain. This is explained in further detail with respect to the timing diagram of FIG. 10.

The implementation according to the present invention uses sixteen total delay stages. Delay is changed by modulating drive strength, essentially by adjusting pull-down and pull-up strength.

Figure 4:
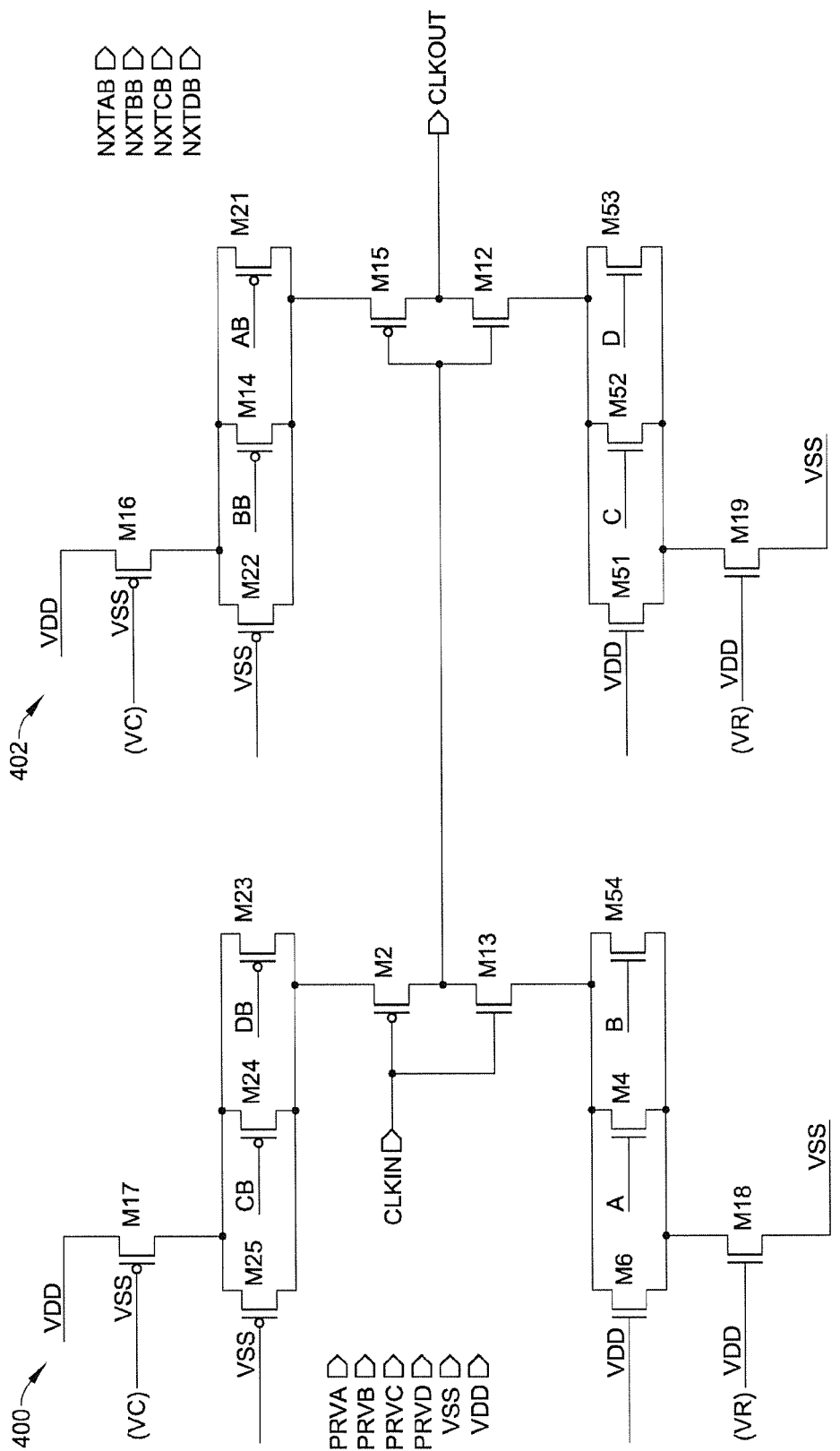
FIG. 4 is a more detailed schematic diagram of a single adjustable delay line stage associated with the adjustable delay line of FIGS. 3A-3D.

Referring now to FIG. 4, two delay stages 400 and 402 are shown coupled together, forming a single register such as register 302 shown in FIGS. 3A-3D. Delay stage 400 includes separate VC and VR temperature control nodes, not dependent upon a phase detector, received respectively by transistors M17 and M18. In the embodiment shown in FIG. 4, the temperature controls are not actually used. Thus, the VC input is coupled to the VSS voltage supply, and the VR input is coupled to the VDD voltage supply. Temperature control of the register and the adjustable delay line is discussed in further detail below. Pull-up transistors include P-channel transistors M25, M24, and M23. The gate of transistor M25 receives the VSS voltage, the gate of transistor M24 receives the CB control signal, and the gate of transistor M23 receives the DB control signal. Delay stage 400 also includes an inverter for receiving the input CLK signal and for providing an intermediate inverted CLK signal comprising P-channel transistor M2 and N-channel transistor M13. Pull-down transistors include N-channel transistors M6, M4, and M54. The gate of transistor M6 receives the VDD voltage, the gate of transistor M4 receives the A control signal, and the gate of transistor M54 receives the B control signal. The A, B, CB, and DB control signals are described in further detail below with respect to the latch circuits of FIGS. 5-8.

Similarly, delay stage 402 includes separate VC and VR temperature control nodes, received respectively by transistors M16 and M19. In the embodiment shown in FIG. 4 the VC and VR controls are not actually used and are coupled to VSS and VDD, respectively. Pull-up transistors include P-channel transistors M22, M14, and M21. The gate of transistor M22 receives the VSS voltage, the gate of transistor M14 receives the BB control signal, and the gate of transistor M21 receives the AB control signal. Delay stage 402 also includes an inverter for receiving the intermediate inverted CLK signal and for providing the output CLKOUT signal, comprising P-channel transistor M15 and N-channel transistor M12. Pull-down transistors include N-channel transistors M51, M52, and M53. The gate of transistor M51 receives the VDD voltage, the gate of transistor M52 receives the C control signal, and the gate of transistor M53 receives the D control signal. The C, D, BB, and AB control signals are described in further detail below with respect to the latch circuits of FIGS. 5-8.

In the default state, in delay cell 400, transistors M24 and M4 are ON, and transistors M23 and M54 are OFF. Similarly, the default state, in delay cell 402, transistors M14 and M52 are ON, and transistors M21 and M53 are OFF. From the default state, transistor M4 is turned off (as well as the equivalent transistor in successive registers if desired) to decrement (slow down) the delay line. (Transistor M21 is switched in conjunction with the switching of transistor M4.) Similarly, from the default state transistor, M54 is turned on (as well as the equivalent transistor in successive registers if desired) to increment (speed up) the delay line. (Transistor M14 is switched in conjunction with the switching of transistor M54.) The CLK signal duty-cycle is adjusted by having the next stage use separate inputs (C and D) vs. (A and B) so that they control opposite edges of the clock being delayed.

Delay line control requires a method for incrementing or decrementing the delay amount, while not having a traditional master/slave architecture. The delay line control is provided by a series of latches chained together such that each latch is dependent on the status of its neighboring latches in order to flip states. The latches are shown in FIGS. 5, 6, 7, and 8. Thus, each of the registers shown in FIGS. 3A-3D includes delay cells 400 and 402, and each of the latch circuits 500, 600, 700, and 800 respectively shown in FIGS. 5-8.

Figures 5, 6, 7, 8:
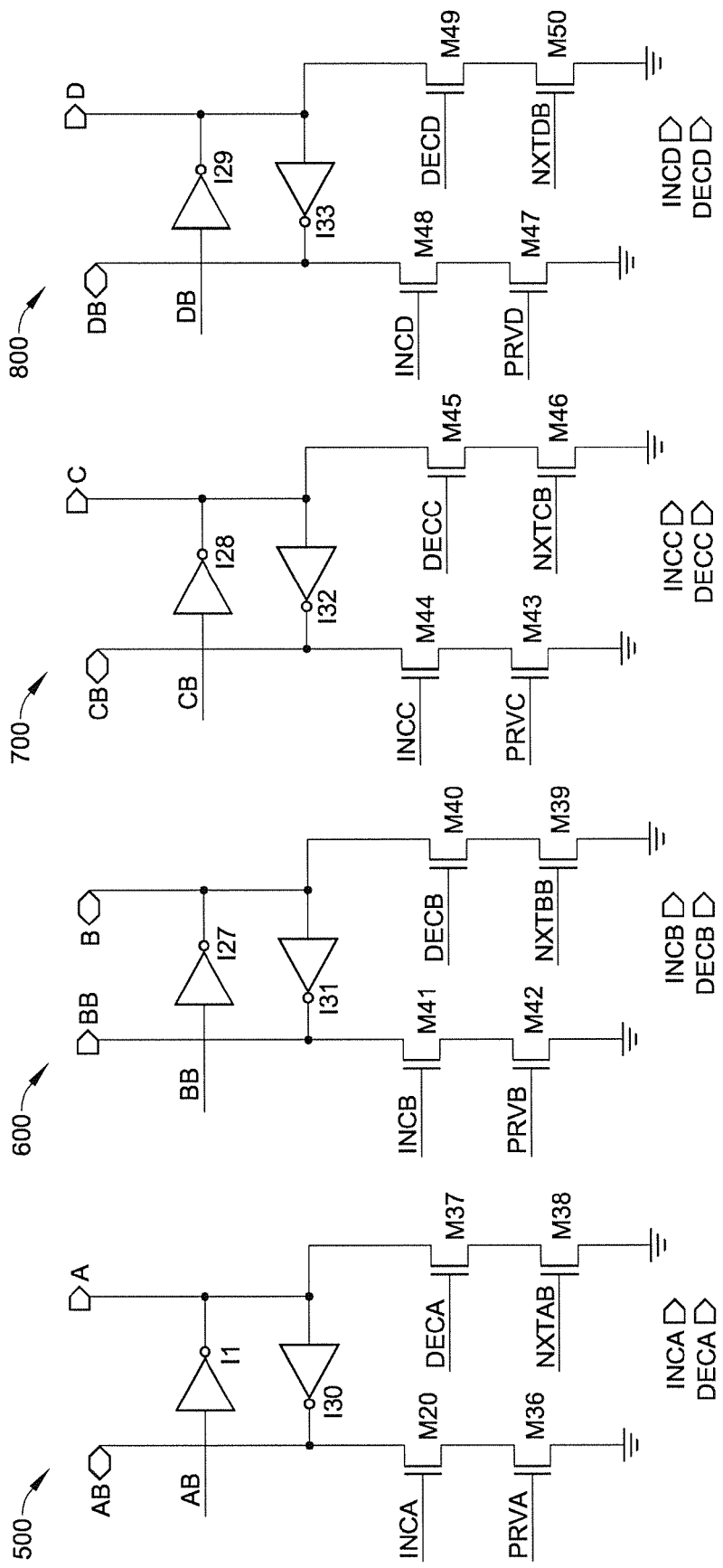
FIGS. 5-8 are more detailed schematic diagrams of latch circuits associated with the adjustable delay line of FIGS. 3A-3D.

A first latch circuit 500 shown in FIG. 5 comprises a latch including cross-coupled inverters 11 and 130 coupled between nodes AB and A. Cascoded N-channel transistors M20 and M36 are coupled between the AB node and ground. The gate of transistor M20 is coupled to the INCA node, and the gate of transistor of M36 is coupled to the PRVA node. Cascoded N-channel transistors M37 and M38 are coupled between the A node and ground. The gate of transistor M37 is coupled to the DECA node, and the gate of transistor M38 is coupled to the NXTAB node.

A second latch circuit 600 shown in FIG. 6 comprises a latch including cross-coupled inverters 127 and 131 coupled between nodes BB and B. Cascoded N-channel transistors M41 and M42 are coupled between the BB node and ground. The gate of transistor M41 is coupled to the INCB node, and the gate of transistor of M42 is coupled to the PRVB node. Cascoded N-channel transistors M40 and M39 are coupled between the B node and ground. The gate of transistor M40 is coupled to the DECB node, and the gate of transistor M39 is coupled to the NXTBB node.

A third latch circuit 700 shown in FIG. 7 comprises a latch including cross-coupled inverters 128 and 132 coupled between nodes CB and C. Cascoded N-channel transistors M44 and M43 are coupled between the CB node and ground. The gate of transistor M44 is coupled to the INCC node, and the gate of transistor of M43 is coupled to the PRVC node. Cascoded N-channel transistors M45 and M46 are coupled between the C node and ground. The gate of transistor M45 is coupled to the DECO node, and the gate of transistor M46 is coupled to the NXTCB node.

A fourth latch circuit 800 shown in FIG. 8 comprises a latch including cross-coupled inverters 129 and 133 coupled between nodes DB and D. Cascoded N-channel transistors M48 and M47 are coupled between the DB node and ground. The gate of transistor M48 is coupled to the INCD node, and the gate of transistor of M47 is coupled to the PRVD node. Cascoded N-channel transistors M49 and M50 are coupled between the D node and ground. The gate of transistor M49 is coupled to the DECD node, and the gate of transistor M46 is coupled to the NXTDB node.

Figure 9:
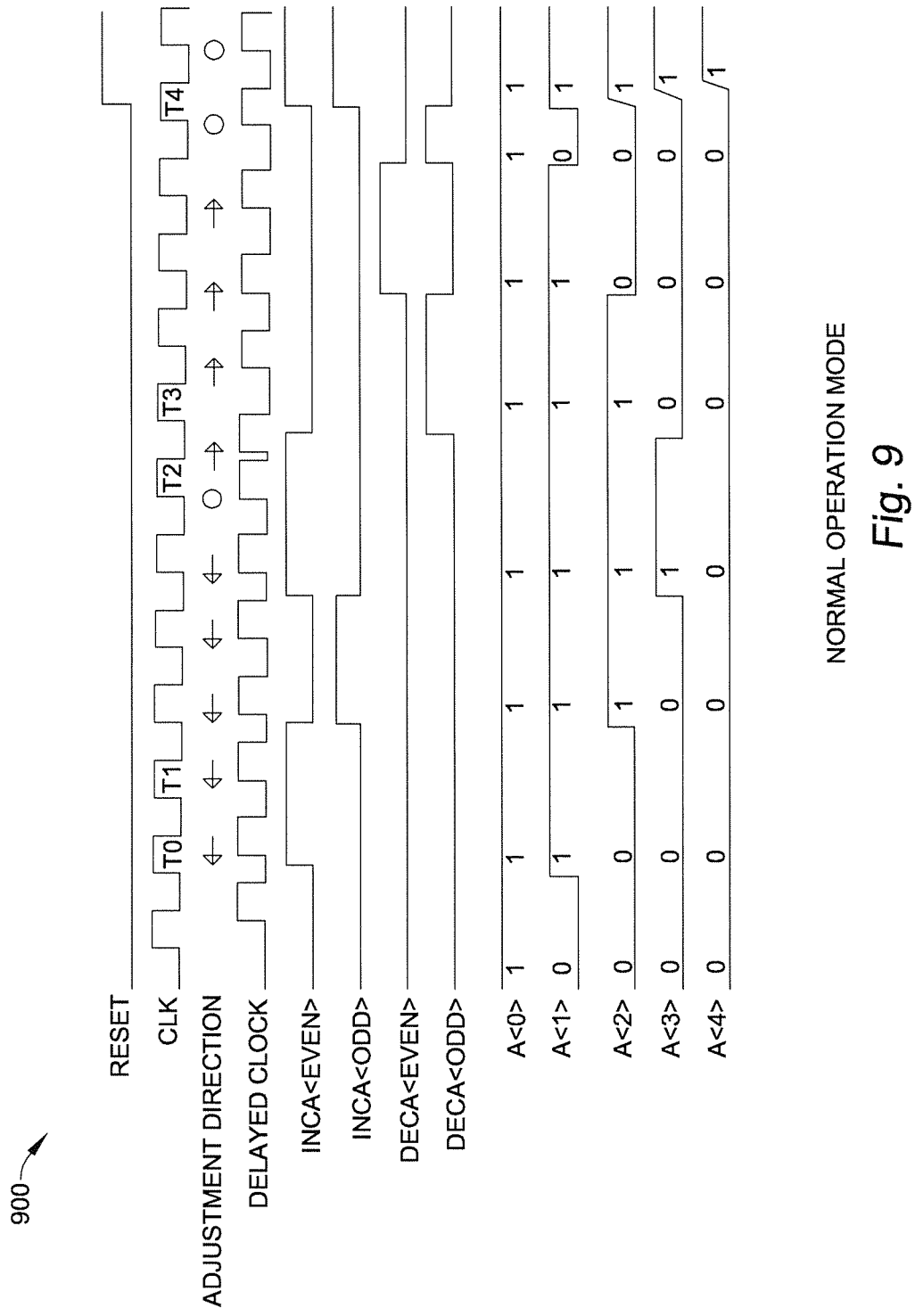
FIG. 9 is a timing diagram associated with the adjustable delay line of FIGS. 3A-3D showing a normal operational mode.
Figure 10:
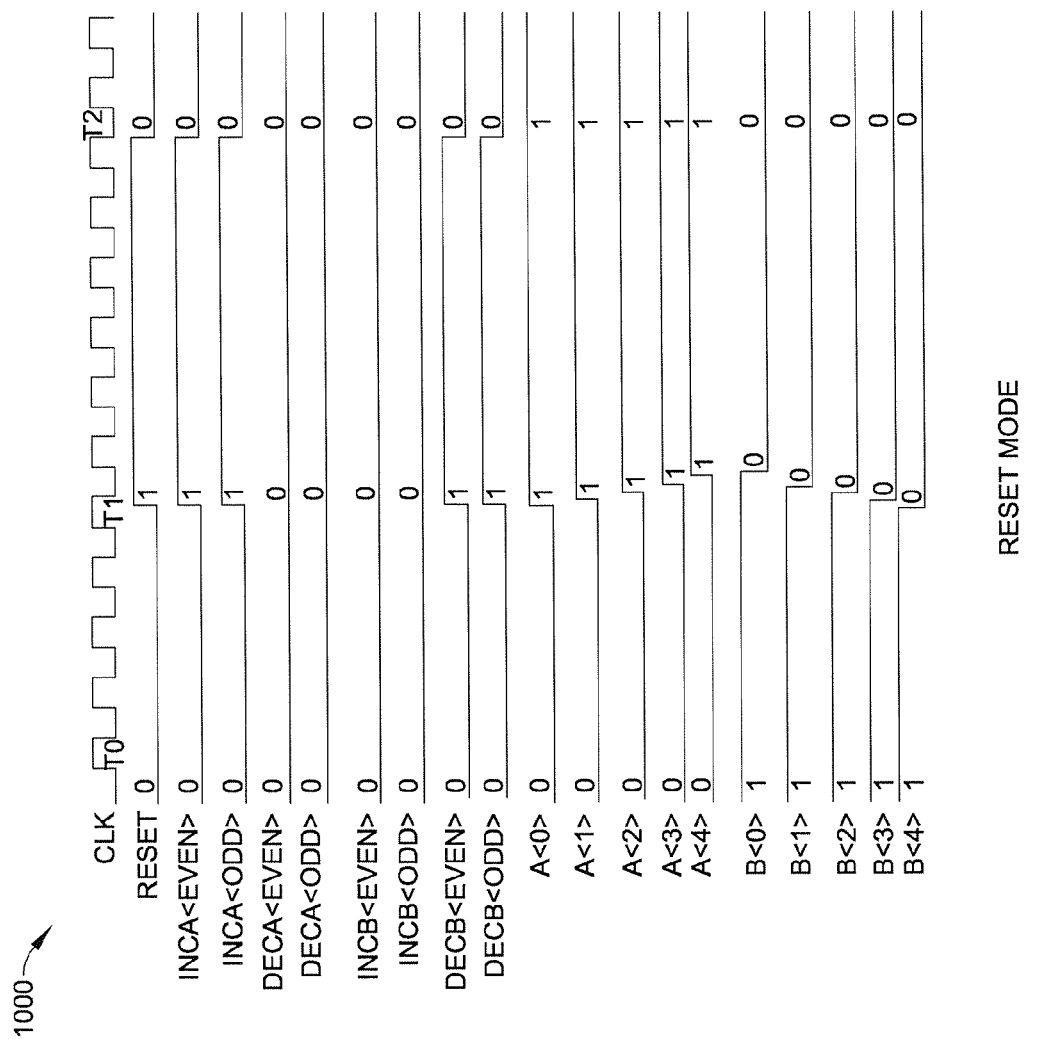
FIG. 10 is a timing diagram associated with the adjustable delay line of FIGS. 3A-3D showing a reset operational mode.

Timing diagrams 900 and 1000 are shown in FIGS. 9 and 10, which respectively describe a normal mode of operation, and a reset mode of operation.

Referring now to FIG. 9, the normal operation mode timing diagram 900 is shown including the CLK input signal and the delayed CLK output signal. Also shown are the INCA<EVEN>, INCA<ODD>, DECA<EVEN>, and DECA<ODD> control signals. Also shown are A<0>, A<1>, A<2>, A<3>, and A<4>, which represent the different delay registers such as delay registers 302 and 304 shown in FIGS. 3A-3D.

At T0 the Delayed CLK is behind the reference clock (CLK), and as the adjustment direction arrow shows, the INCA<EVEN> signal goes high to increment the A register chain and decrease the delay on the Delayed CLK. At T1 the Delayed CLK is still behind the CLK, however, for this illustration, the adjustment controller has been set to a two clock filter, such that only after two consecutive times of being behind (or ahead) of the CLK will a correction be made. As a result of the filtering, which can be set to any amount, the correction is not performed at T1. At T2 the Delayed clock is now matched with the CLK and no correction is needed. At T3 the Delayed CLK is now ahead of CLK and so DECA<ODD> goes high to decrement the A register chain and increase the delay on Delayed CLK. At T4 RESET has been asserted and the register chain goes into reset mode.

Referring now to FIG. 10, the reset operation mode timing diagram 1000 is shown including the CLK input signal and the RESET signal. Also shown are the INCA<EVEN>, INCA<ODD>, DECA<EVEN>, and DECA<ODD> control signals. Also shown are A<0>, A<1>, A<2>, A<3>, and A<4>, as well as B<0>, B<1>, B<2>, B<3>, and B<4>, which also represent the different delay registers 302 and 304 shown in FIGS. 3A-3D.

At T0 the system is in normal operation mode. At T1 the (asynchronous) RESET signal is asserted high putting the chain into reset mode by setting INCA<EVEN,ODD> both high and DECB<EVEN,ODD> both high as well. When both EVEN and ODD of an increment or decrement are asserted at the same time the register chain ripples a '1' through the chain if it was an increment or a '0' if it was a decrement. At T1 the A register chain ripples a '1' because both INCA's are asserted, and the B register chain ripples a '0' because both DECB's are asserted. At T2 RESET is asserted low and the chain goes back into normal operation mode with the total delay in a balanced state allowing for equal amount of delay to be added or removed.

In the present invention, the delay through the delay line is controlled by varying the power supply voltage. This is accomplished digitally via quantized steps. Having the delay line run at a different voltage than the main supply leads to timing errors due to level shifting and phase differences between the supplies. Having anything adjusted via quantized steps means there will be discrete shifts in the timing. The delay line of the present invention is constantly making slight analog adjustments so the any timing difference is not seen as a quantized difference.

The delay line has two adjustment modes going on in parallel. The primary adjustment is digitally based and this is what is set on the initial locking of the delay line. The digital adjuster also continues to work throughout the operation of the delay line. The temperature adjuster continually works in the background and parallel to the main digital adjuster. This mitigates the issue of the delay starting and locking at one temperature, usually cold, and then having to run at a different temperature, usually hot, as the part continues into normal operation. If the main digital adjustment circuitry had to cover the initial locking, any frequency changes due to jitter, and the possible temperature shifts, the delay line would be too long and too many adjustment stages would be required. The longer the delay line, the greater the chance that error is introduced due to jitter within the line itself.

Each leg within the basic delay element of the delay line has two adjustment modes in series. The first one being digitally controlled and responsive to a phase detector of some sort as has been previously described. The second one being only responsive to a temperature sensing circuit as is shown in FIG. 11. FIG. 11 shows a temperature sensing and control circuit 1100. The inputs to control circuit 1100 are the power supply voltages VDD and VSS, and are sensitive to the external temperature. The outputs of control circuit are the VC and VR temperature control voltages that are coupled to the VC and VR nodes shown in FIG. 4. Note that these nodes are coupled to VSS and VDD, respectively as these control nodes can be effectively disabled if not required, as many modern semiconductor processes are substantially temperature invariant.

The programmable portion of the delay line which is set on initial locking as previously described may also contain this temperature compensation as is shown in FIG. 11. The result of which is very little delay change versus temperature throughout the entire delay line, not just the variable portion.

In the embodiment of the present invention shown in FIG. 4, the voltage VR will change in response to temperature such that the delay will remain constant. VR is attached to the gate of an N-channel device within the delay elements. VC, which is attached to the gate of a p-channel device, may also change for added compensation range.

Any number of circuits could be selected to generate the VR or VC control signal, such as any number of temperature sensitive circuits that are well known in the art. A general representative circuit 1100 is shown in FIG. 11. Some specific examples are solid state thermometers and bipolar transistor thermometers.

In conclusion, a novel delay circuit for use in a DLL has been shown, which uses universal increment and decrement signals, is in conjunction with an even and odd signal. When incrementing the registers an increment signal is valid while the even/odd signal toggles. If the even signal is held valid and does not toggle with the odd signal then the register will not increment. The same is true for decrementing. As an increment occurs the registers then checks the status of the previous register, if it is not currently holding a logic '1' then the register ignores the increment, while decrementing checks the status of the next latch. Each register is only dependent on its neighboring register allowing the addition or reduction in the amount of registers in the chain to be done on an individual basis. The ends of the delay chain are tied off to preset values. As the chain increments the number of logic 2's existent within the chain increases, while decrementing lowers that number.

Referring now to FIG. 12, a block diagram of a DLL 1200 is shown including a feature for preventing the delay elements from being digitally controlled after an initial locking period. The block diagram includes an initial lock block 1202 and a linear progression/delay registers block 1208 coupled to the temperature control block 1204. The CLK input signal (A) and the output (C) of block 1208 are received by the detect block 1206. The output of detect block 1206 is fed back to block 1208. The signal on node (C) is the output of the DLL 1200.

In FIG. 12 the CLK signal goes into the initial lock block 1202, which then turns on one of the switches 1210 to tap off from. One of 32 switches (only four are shown in FIG. 12) will connect, tapping off from one point in the series of elements such that the input into the linear progression delay register sees only "x" (wherein "x" is less than 32) number of elements from the initial lock. The temperature control output (VR and VC) connects both to the linear progression delay registers and the initial lock. The phase detect output however only goes to the delay registers (this output is coupled to the INC and DEC inputs previously described).

Although an embodiment of the present invention has been described for purposes of illustration, it should be understood that various changes, modifications and substitutions may be incorporated in the embodiment without departing from the spirit of the invention that is defined in the claims, which follow. For example, a single edge delay register such as only the "A" registers to control delay in only one element could be used. Skipping more than one element per increment/decrement is also contemplated. Many other variations of the INC and DEC signals are possible within the scope of the present invention.

We claim:

1. A digitally adjustable delay line comprising a series of equal delay elements, wherein each delay element is configured to be adjustable to increase or decrease the propagation delay therethrough by adjusting a single delay element based on the state of a previous delay element.

2. The adjustable delay line of claim 1 wherein each delay element comprises a plurality of register bits.

3. The adjustable delay line of claim 1 comprising adjusting signals for incrementing and decrementing each delay element.

4. The adjustable delay line of claim 1 wherein alternating delay elements are in a master-slave relationship.

5. The adjustable delay line of claim 1 wherein the number of delay elements can be made unequal to a power of two.

6. The adjustable delay line of claim 1 wherein the delay elements are configured so that subsequent increments or decrements are not modified in adjacent delay elements within the adjustable delay line.

7. The adjustable delay line of claim 1 wherein each delay element comprises separate rising edge and falling edge controls so that the duty cycle of a final delayed output signal can be modified.

8. The adjustable delay line of claim 1 further comprising a reset circuit.

9. The adjustable delay line of claim 8 wherein the reset circuit is configured to defeat a master-slave relationship in the delay elements and allows an input signal to propagate through the entire delay line.

10. A delay element for a delay line comprising:
    a first inverter having an input for receiving a clock signal, and an output;
    a second inverter having an input coupled to the output of the first inverter, and an output for providing a delayed clock signal;
    a first pull-up circuit coupled to a first power terminal of the first inverter and a first pull-down circuit coupled to a second power terminal of the first inverter;
    a second pull-up circuit coupled to a first power terminal of the second inverter and a second pull-down circuit coupled to a second power terminal of the second inverter;
    a first latch circuit coupled to the first pull-down circuit and the second pull-up circuit;
    a second latch circuit coupled to the first pull-down circuit and the second pull-up circuit;
    a third latch circuit coupled to the second pull-down circuit and the first pull-up circuit; and
    a fourth latch circuit coupled to the second pull-down circuit and the first pull-up circuit.

11. The delay element of claim 10 wherein the first latch circuit includes an increment input for receiving a first increment signal, and a decrement input for receiving a first decrement signal.

12. The delay element of claim 11 wherein the second latch circuit includes an increment input for receiving a second increment signal, and a decrement input for receiving a second decrement signal.

13. The delay element of claim 12 wherein the third latch circuit includes an increment input for receiving a third increment signal, and a decrement input for receiving a third decrement signal.

14. The delay element of claim 13 wherein the fourth latch circuit includes an increment input for receiving a fourth increment signal, and a decrement input for receiving a fourth decrement signal.

15. The delay element of claim 10 wherein the first latch circuit comprises:
    a cross-coupled inverter latch coupled between a first latch node and a second latch node;
    a first transistor coupled to the first latch node for receiving a first increment signal; and
    a second transistor coupled to the second latch node for receiving a first decrement signal.

16. The delay element of claim 15 wherein the second latch circuit comprises:
    a cross-coupled inverter latch coupled between a first latch node and a second latch node;
    a first transistor coupled to the first latch node for receiving a second increment signal; and
    a second transistor coupled to the second latch node for receiving a second decrement signal.

17. The delay element of claim 16 wherein the third latch circuit comprises:
    a cross-coupled inverter latch coupled between a first latch node and a second latch node;
    a first transistor coupled to the first latch node for receiving a third increment signal; and
    a second transistor coupled to the second latch node for receiving a third decrement signal.

18. The delay element of claim 17 wherein the fourth latch circuit comprises:
    a cross-coupled inverter latch coupled between a first latch node and a second latch node;
    a first transistor coupled to the first latch node for receiving a fourth increment signal; and
    a second transistor coupled to the second latch node for receiving a fourth decrement signal.

19. A delay line comprising:
    a plurality of serially-coupled delay registers each comprising a plurality of increment inputs and a plurality of decrement inputs;
    a first alternating set of delay registers receiving a plurality of even increment signals and a plurality of even decrement signals; and
    a second alternating set of delay registers receiving a plurality of odd increment signals and a plurality of odd decrement signals.

20. The delay line of claim 19 wherein each delay register comprises:
    first and second serially coupled inverters;
    a first pull-up circuit coupled to a first power terminal of the first inverter and a first pull-down circuit coupled to a second power terminal of the first inverter;
    a second pull-up circuit coupled to a first power terminal of the second inverter and a second pull-down circuit coupled to a second power terminal of the second inverter;
    a first latch circuit coupled to the first pull-down circuit and the second pull-up circuit;
    a second latch circuit coupled to the first pull-down circuit and the second pull-up circuit;
    a third latch circuit coupled to the second pull-down circuit and the first pull-up circuit; and
    a fourth latch circuit coupled to the second pull-down circuit and the first pull-up circuit.

* * * * *